United States Patent
Paek et al.

(10) Patent No.: US 7,268,021 B2
(45) Date of Patent: Sep. 11, 2007

(54) LEAD FRAME AND METHOD OF MANUFACTURING THE SAME

(75) Inventors: Sung-kwan Paek, Changwon-si (KR); Se-chuel Park, Changwon-si (KR); Sang-hun Lee, Changwon-si (KR)

(73) Assignee: Samsung Techwin Co., Ltd. (KR)

( * ) Notice: Subject to any disclaimer, the term of this patent is extended or adjusted under 35 U.S.C. 154(b) by 365 days.

(21) Appl. No.: 10/981,417

(22) Filed: Nov. 4, 2004

(65) Prior Publication Data
US 2005/0233566 A1   Oct. 20, 2005

(30) Foreign Application Priority Data
Apr. 16, 2004   (KR) .................. 10-2004-0026204

(51) Int. Cl.
H01L 23/495 (2006.01)
B32B 15/01 (2006.01)
B32B 15/20 (2006.01)

(52) U.S. Cl. .............. 438/123; 428/675; 428/620; 428/670; 428/672; 428/674; 257/677; 257/666; 257/E23.041

(58) Field of Classification Search ............ 438/123, 438/763; 257/666, 677, E23.031, E23.041, 257/E23.157; 428/620, 670, 672, 674, 675
See application file for complete search history.

(56) References Cited

U.S. PATENT DOCUMENTS

| | | | | |
|---|---|---|---|---|
| 5,453,293 A | * | 9/1995 | Beane et al. | 427/96.1 |
| 5,510,197 A | * | 4/1996 | Takahashi et al. | 428/670 |
| 5,614,320 A | * | 3/1997 | Beane et al. | 428/403 |
| 5,684,329 A | * | 11/1997 | Serizawa | 257/677 |
| 5,958,607 A | * | 9/1999 | Kim et al. | 428/675 |
| 6,194,777 B1 | * | 2/2001 | Abbott et al. | 257/666 |
| 6,579,623 B2 | * | 6/2003 | Kurihara et al. | 428/556 |
| 2002/0192488 A1 | * | 12/2002 | Kurihara et al. | 428/621 |
| 2002/0192492 A1 | * | 12/2002 | Abys et al. | 428/647 |
| 2004/0014266 A1 | * | 1/2004 | Uno et al. | 438/200 |
| 2005/0184366 A1 | * | 8/2005 | Lee et al. | 257/666 |
| 2005/0233566 A1 | * | 10/2005 | Paek et al. | 438/611 |

FOREIGN PATENT DOCUMENTS

| | | | |
|---|---|---|---|
| JP | 10-22429 | * | 1/1998 |
| JP | 10-22433 | * | 1/1998 |
| JP | 10-163397 | * | 6/1998 |
| JP | 11-111909 | * | 4/1999 |

* cited by examiner

Primary Examiner—M. Wilczewski
(74) Attorney, Agent, or Firm—Tuchman & Park LLC

(57) ABSTRACT

A lead frame having a structure that can discharge hydrogen adsorbed during deposition and can reduce a galvanic potential difference between plating layers and a method of manufacturing the same are provided. The method includes forming a Ni plating layer formed of Ni or a Ni alloy on a base metal layer formed of a metal, forming a Pd plating layer formed of Pd or an Pd alloy on the Ni plating layer, heat-treating the Ni plating layer and the Pd plating layer, and forming a protective plating layer on the heat-treated Pd plating layer.

17 Claims, 9 Drawing Sheets

1

LEAD FRAME AND METHOD OF MANUFACTURING THE SAME

BACKGROUND OF THE INVENTION

This application claims the priority of Korean Patent Application No. 2004-26204, filed on Apr. 16, 2004, in the Korean Intellectual Property Office, the disclosure of which is incorporated herein in its entirety by reference.

FIELD OF THE INVENTION

The present invention relates to a lead frame for a semiconductor device and to a method of manufacturing the lead frame.

DESCRIPTION OF THE RELATED ART

A lead frame is a structural element forming a semiconductor package with a semiconductor chip mounted thereon, and performs as a lead for connecting the semiconductor package to an external device and as a frame for supporting the semiconductor chip.

FIG. 1 is a plan view of a typical lead frame 100 that comprises a die pad 110 and plural leads 120 arranged about the die pad 110. The die pad 110 connects to a side rail 170 at the four corners by a pad supporting lead 180, and supports a semiconductor chip mounted thereon.

The lead 120 includes inner leads 130 and outer leads 140 arranged about the circumference of the die pad 110. Dam bars 160 are formed between the inner lead 130 and the outer lead 140, and provide a frame structure for the inner lead 130 and the outer lead 140. The side rail 170 and the dam bars 160 are to be removed after the fabrication of a semiconductor package is completed.

A conventional assembly process for assembling a semiconductor package with the lead frame and semiconductor chip includes a die attaching process, a wire bonding process, and a molding process. The die attaching process is a process for attaching a chip (die) to the die pad of the lead frame, and the wire bonding process is a process for connecting terminals of the semiconductor chip to the inner leads of the lead frame using a conductive material such as a gold wire. The molding process is a process for sealing the chip, the wires, and the inner leads using an insulating material such as a thermosetting resin.

In such an assembly process, the die pad 110 and the inner leads 130 are coated or plated with a metal having a predetermined characteristic for providing enhanced adhesiveness to the semiconductor chip to be attached on the die pad 110 in the die attaching process and also for providing enhanced adhesiveness to the wires to be bonded with the inner leads 130 in the wire bonding process. Also, a soldering base plating is performed on a selected region of the outer leads 140 using a tin-lead (Sn—Pb) alloy in order to improve the soldering wettability when the outer leads 140 of the semiconductor device is mounted on a substrate.

However, the soldering base plating in the semiconductor packaging process has several known drawbacks. For example, the soldering plating process requires tedious and troublesome working steps. Also, the lead components on the exposed lead and the lead plating solution can cause environmental problems. Moreover, the plating solution can penetrate into a gap between the surface of the lead frame and the epoxy molding, and often causes defects in the semiconductor chips. In addition, an additional process for correcting a non-uniformity in the plating layer is often required.

Recently, a pre-plated frame method is suggested as a solution for the above problems. In this method, a metal having a high soldering wettability is coated prior to the semiconductor packaging process to omit the plating process during the packaging process. The pre-plating method draws an attention since the pre-plated lead frame involves a relatively simple process, and the environmental contamination problem can be avoided in the semiconductor packaging process.

FIG. 2 is a cross-sectional view illustrating a construction of a lead frame manufactured by a conventional pre-plating method, for example, disclosed in Japanese Patent No. 1501723.

Referring to FIG. 2, a nickel (Ni) plating layer 122 is formed on the entire surface of a base metal layer 121, which has copper as a main component, and a palladium (Pd) plating layer 123 is formed above the Ni plating layer 122. That is, the Ni and Pd are sequentially plated on the base metal layer 121.

The Ni plating layer 122 prevents formation of oxides or sulfides occurring from diffusion of copper or iron components of the base metal layer 121 to a surface of the lead frame. The Pd plating layer 123 provides a high soldering wettability and protects the surface of the Ni plating layer 122.

However, when plating the lead frame 120, if defects exist on the surface of the base metal layer 121 in spite of a pre-treatment, the Ni plating progresses more rapidly on the defect regions than other regions since the surface energy in the defect regions is greater than other regions, thereby resulting in a rough plating surface on the defect regions and a poor adhesion due to the unbalance in the plating over the plating surface.

Moreover, when forming the Pd plating layer 123 thereon, a large amount of hydrogen adheres or absorbs into the surface during the plating since the electrode potential difference between the Pd and hydrogen is very little. The hydrogen component adhered thereto increases internal stress of the Pd plating layer 123. Further, when forming the Pd plating layer 123 on the defected regions of the Ni plating layer 122, a substantial amount of hydrogen can be absorbed and adhered in the area during the Pd deposition since the deposition potential of the Pd is similar to that of the hydrogen. Due to the increased internal stress caused by the adsorption of the hydrogen, density of the plating layer is reduced, thereby the plating layer can be easily peeled off at least in part.

The reduced density of the Pd plating layer 123 can also cause an oxidation of the Ni plating layer 122, and thereby causes reduction of the soldering wettability and the bondability of the wires during the wire bonding process. Also, the soldering wettability of the Pd layer can be further reduced since the surface of the outermost Pd plating layer 123 is oxidized by a thermal hysteresis process therein.

As a solution to these problems, a method of forming a protective layer 124 on the Pd plating layer 123 of the leads 120 of a lead frame is disclosed in U.S. Pat. No. 4,529,667 as depicted in FIG. 3.

According to U.S. Pat. No. 4,529,667, the base metal layer 121 of the lead frame is formed of copper, a copper alloy, or an iron-nickel alloy. The lead frame includes a Ni plating layer 122 formed of Ni or an Ni alloy on a base metal layer 121, a Pd plating layer 123 formed of Pd or a Pd alloy on the Ni plating layer 122, and a protective plating layer 124 formed of silver (Ag) or an Ag alloy on the Pd plating layer 123.

This method can provide an improved soldering wettability by effectively preventing the surface of the Pd plating layer 123 from oxidizing due to the plating of Ag on the Pd plating layer 123 since silver has a characteristic of high anti-oxidative. This method thus provides a favorable result when there is no physical defect on the surface of the pre-plated lead frame.

However, cracks can form in the plating texture surface during the subsequent packaging or handling processes of the semiconductor device. As a result, the plating layer can be partially peeled off due to the cracks, and thus providing a peeled portion of the Ni plating layer 122 and the Pd plating layer 123 which is exposed to the environment. Consequently, this peeled surface can be subject to corrosion because of a galvanic potential difference caused by the exposure of the plating layers to the air.

Here, the corrosion problem becomes severer if the base metal layer 121 is formed of "alloy 42". Alloy 42 is a material widely used to form the lead frame and composed of about 42% of Ni, about 58% of Fe, with some other minor components. There is a large dielectric difference between the components constituting the alloy 42, such as Ni or Fe, and the component of the Pd plating layer 123, and the Ag component of the protective plating layer 124. Accordingly, a severe corrosion can be caused by a galvanic coupling due to the dielectric difference.

In particular, as depicted in FIG. 3, cracks or defects can easily occur in the lead frame during the manufacturing process, and the protective plating layer 124 can be peeled off because of the cracks or the defects. As a result, the Ni plating layer 122 and the Pd plating layer 123 are exposed to oxygen in the air. Therefore, the corrosion problem due to formation of the galvanic coupling on the exposed area 120c still remains.

SUMMARY OF THE INVENTION

The present invention is directed to a lead frame having a structure capable of reducing a galvanic potential difference between plating layers, and to a method of manufacturing the lead frame.

The present invention also provides a lead frame, and a method of manufacturing the lead frame, that can discharge hydrogen to the outside which is adsorbed in the plating layer during plating of the layer, and thus reducing air pockets and related defects in the layer.

According to one aspect of the present invention, a method of producing a lead frame comprises: providing a base layer formed of a metallic material; plating a Ni or Ni alloy layer on the base layer; plating a Pd or Pd alloy layer on the Ni or Ni alloy layer; heat-treating the Ni or Ni alloy layer and the Pd or Pd alloy layer, and thereby providing a diffusion layer at least in the Pd or Pd alloy layer with metallic constituents of the diffusion layer thermally diffused; and, forming a protective plating layer on the diffusion layer.

The diffusion layer contains Pd and Ni which is thermally diffused between the Ni plating layer and the Pd plating layer preferably in a manner such that the concentration rate of Pd gradually increases from a lower surface of the diffusion layer to an upper surface of the diffusion layer.

The method of producing the lead frame preferably includes removing of an oxide layer formed on a surface of the metal diffusion layer after forming the metal diffusion layer.

The base metal layer is preferably formed of "alloy 42".

According to another aspect of the present invention, a method of producing a lead frame comprises: forming a first plating layer composed of an Ni alloy on a base metal layer formed of a metal; heat-treating the first plating layer, and thereby providing a diffusion layer in the first plating layer with metallic constituents of the layer thermally diffused therein; and, forming a protective plating layer on the diffusion layer.

The first plating layer is preferably formed of a Ni—Pd alloy.

The method of producing the lead frame preferably further comprises forming of a second plating layer composed of Pd or a Pd alloy on the first plating layer, and the heat-treating step is performed after forming the first and second plating layers.

According to another aspect of the present invention, a lead frame for a semiconductor device comprises: a base metal layer formed of a metal; a Ni plating layer formed of Ni or a Ni alloy on the base metal layer; a diffusion layer formed on the Ni plating layer and containing Pd and Ni with a Pd concentration of the diffusion layer gradually increasing from a lower surface of the diffusion layer to an upper surface of the diffusion layer; and, a protective plating layer formed on the diffusion layer.

The diffusion layer of the lead frame is preferably obtained by heat treatment of the lead frame after forming a Pd plating layer on the Ni plating layer.

According to the present invention, the lead frame having can restrict a surface of the lead frame from corrosion since density of the plating layer can be increased and other defects discussed above in association with the conventional lead frames can be substantially reduced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF INVENTION

The present invention will now be described more in details with reference to the accompanying drawings in which exemplary embodiments of the invention are shown.

Figure 1:
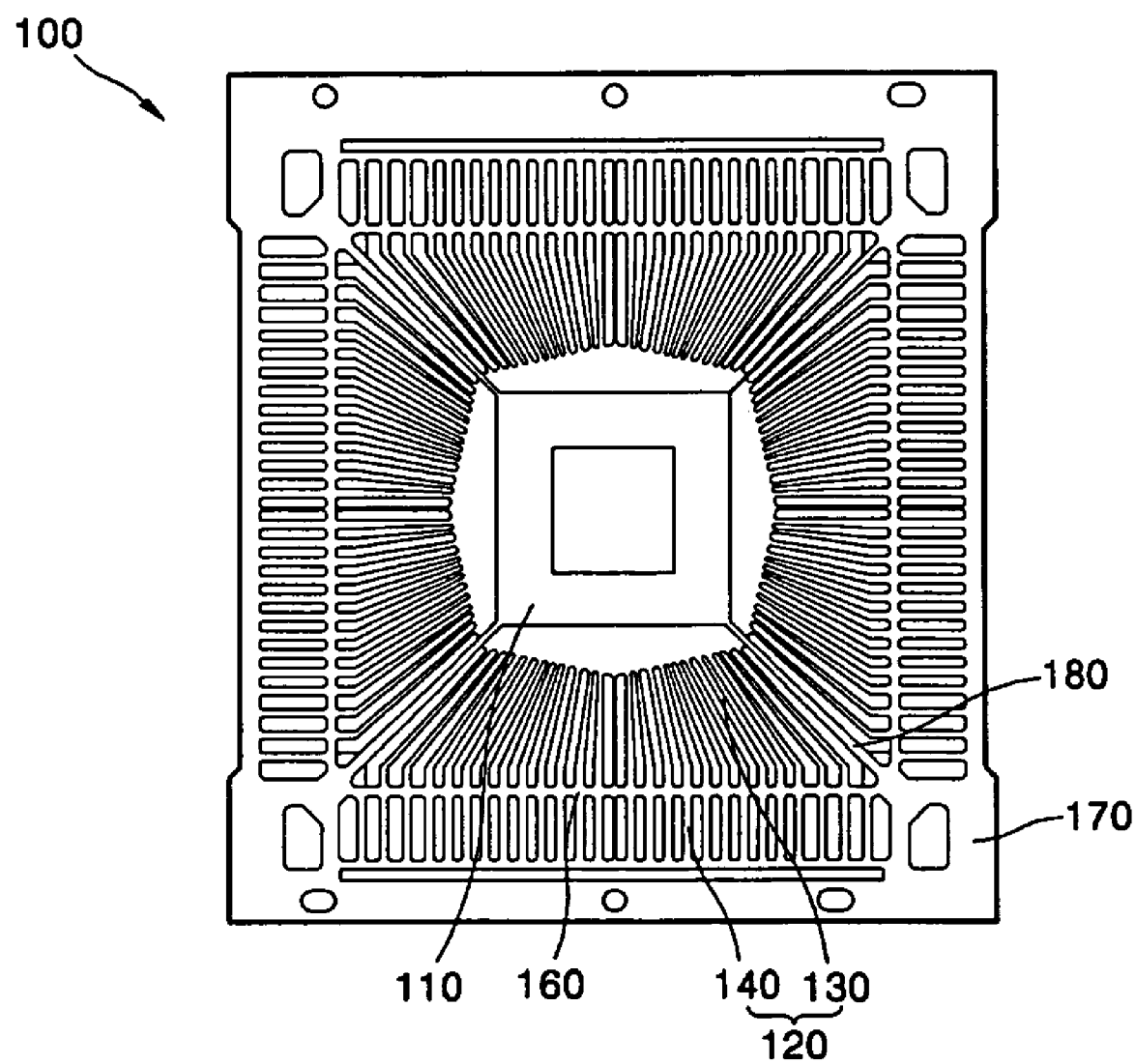
FIG. 1 is a plan view illustrating a typical lead frame.
Figure 2:
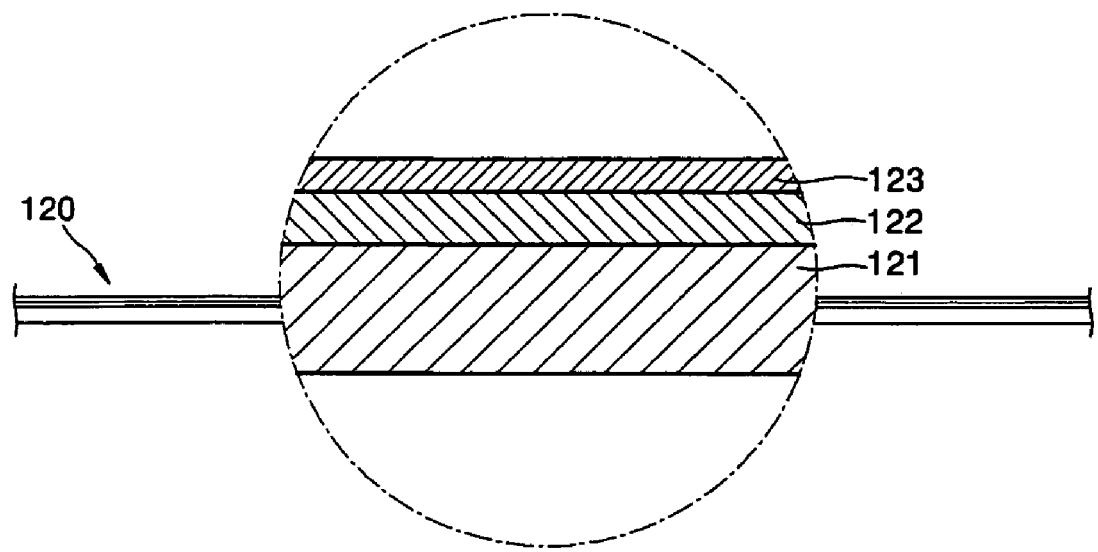
FIG. 2 is a partial, cross-sectional view illustrating the plating layers of a conventional lead frame.
Figure 3:
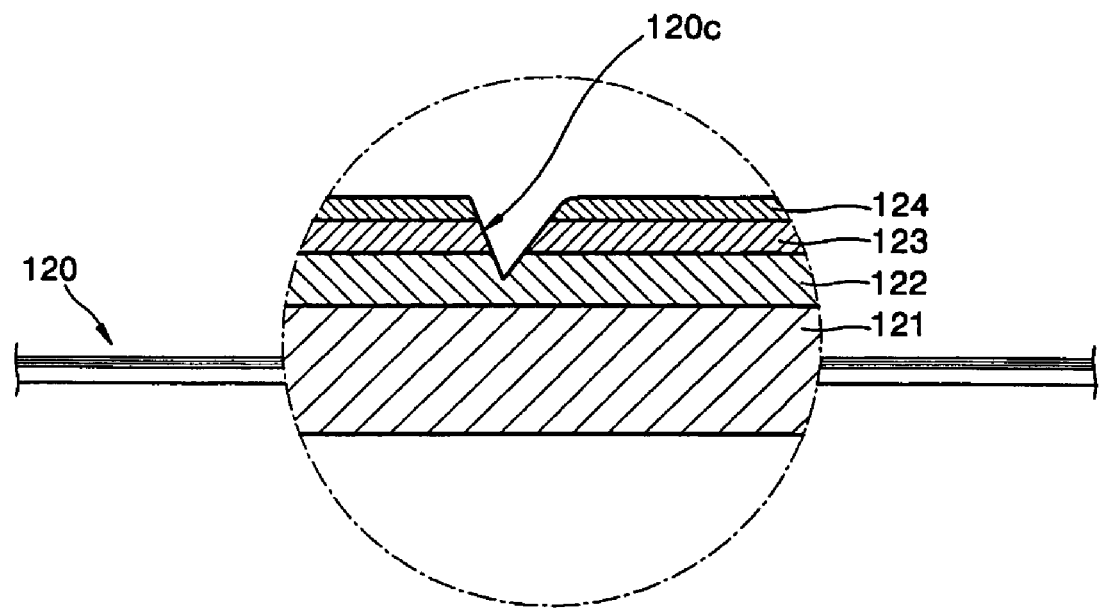
FIG. 3 is a partial, cross-sectional view illustrating the plating layers of another conventional lead frame.
Figure 4:
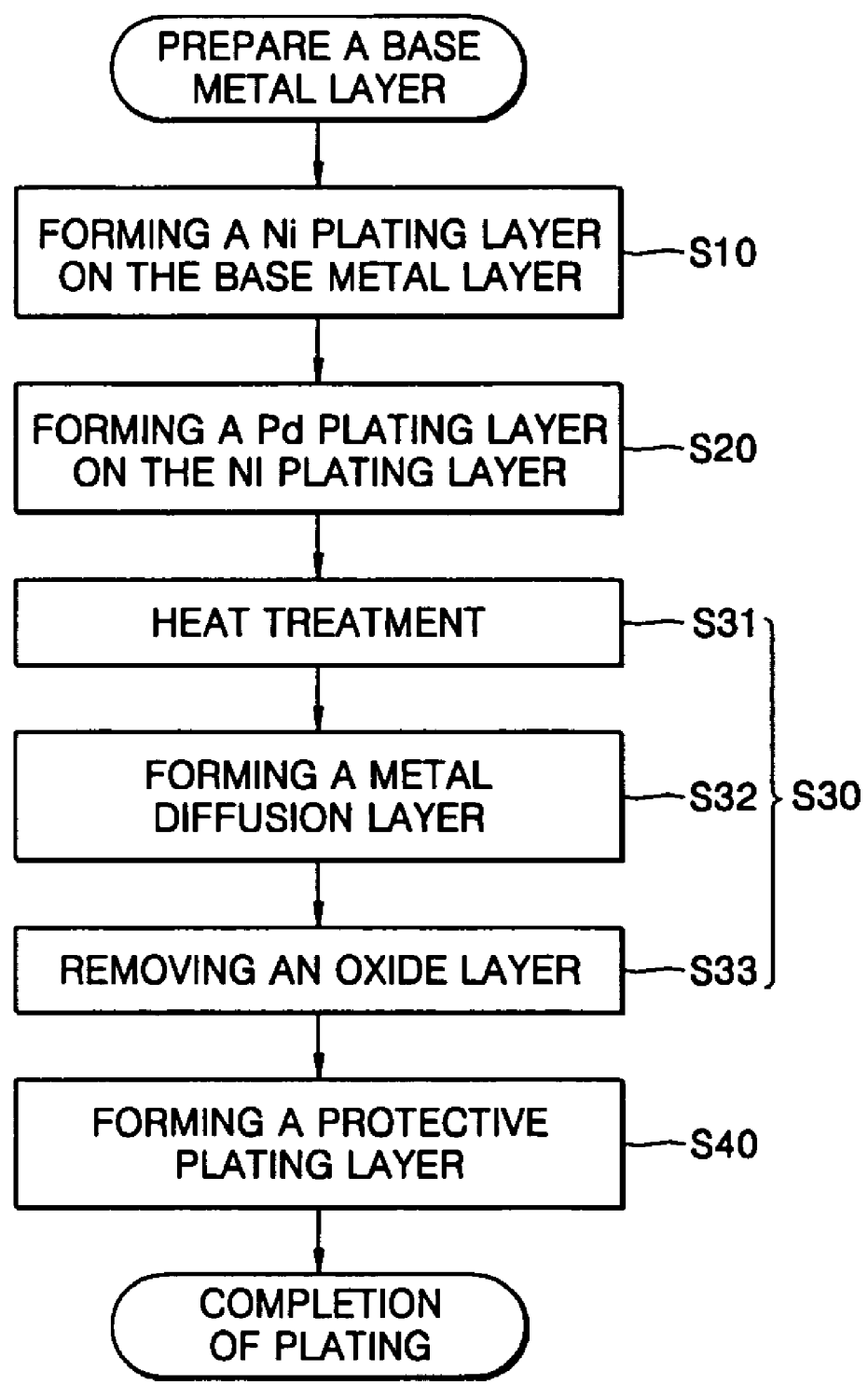
FIG. 4 is a flow chart illustrating a method of manufacturing a lead frame according to one embodiment of the present invention.
Figure 5A:
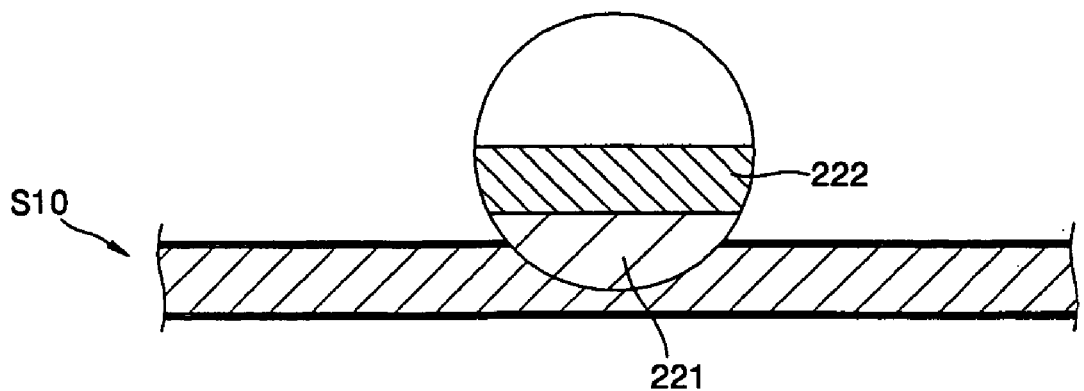
FIGS. 5A through 5D are partial and cross-sectional views illustrating a formation process of the lead frame according to one embodiment of the present invention.
Figure 5B:
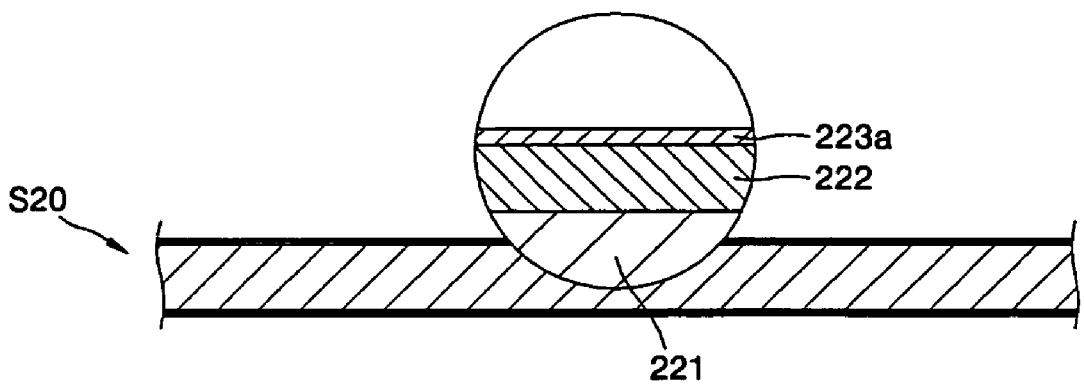
Figure 5C:
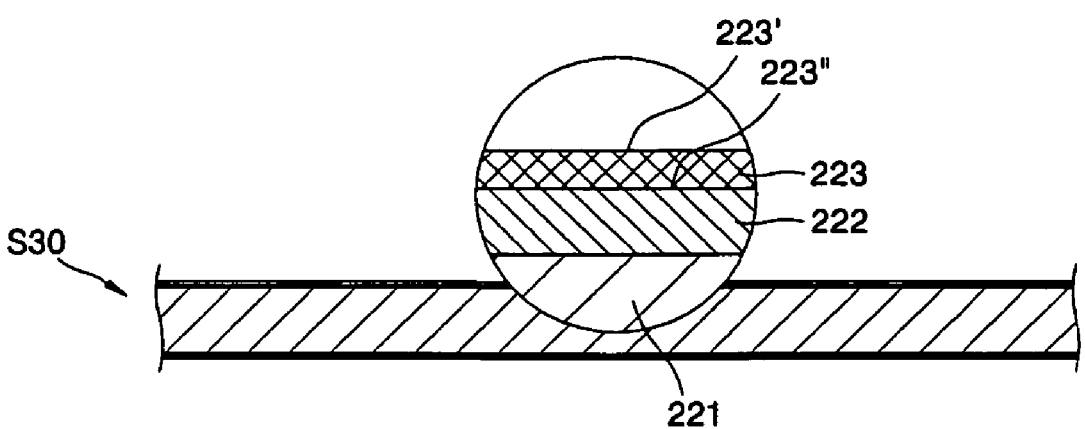
Figure 5D:
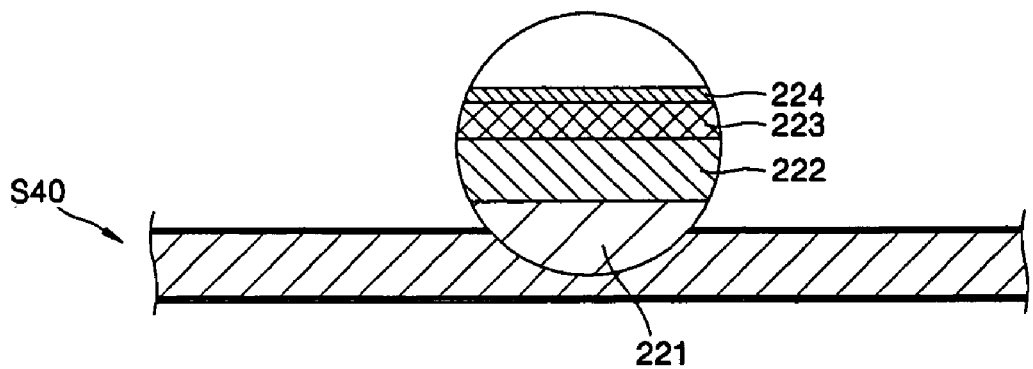

FIG. 4 is a flow chart illustrating a method of manufacturing the lead frame according to one embodiment of the present invention. FIGS. 5A through 5D are partial and cross-sectional views illustrating a process and construction of the lead frame according to one embodiment of the present invention. By the process, plating layers are formed on a base metal layer of the lead frame prior to packaging of the semiconductor chip with the lead frame.

Referring to FIGS. 4, and 5A-5D, a base metal layer 221 is provided in the form of a bare frame for the lead frame. The base metal layer 221 is formed of a suitable metal known in the art, such as copper or alloy 42.

A Ni plating layer 222 is formed thereon by plating Ni or a Ni alloy on a surface of the base metal layer 221 (S10). The Ni plating layer 222 prevents the metal components, such as Cu, Ni, or Fe, of the base metal layer 221 from diffusing into the surface of the lead frame.

Thereafter, a Pd plating layer 223a is formed thereon by plating Pd or a Pd alloy on the Ni plating layer 222 (S20). The Pd or Pd alloy of the Pd plating layer 223a is a metal having very high soldering wettability, and also functions to protect the surface of the Ni plating layer 222.

The Ni or Ni alloy of the Ni plating layer 222 has a large galvanic potential difference from the Pd or Pd alloy of the Pd plating layer 223a. A galvanic coupling can occur in the Ni plating layer 222 and the Pd plating layer 223a when the Ni plating layer 222 and the Pd plating layer 223a are exposed to the air, due to the large galvanic potential difference between the two layers 222 and 223a, thereby causing corrosion of the lead frame.

Since a deposition potential of Pd is similar to that of hydrogen, a large amount of hydrogen can be attached or adsorbed therein during deposition or electroplating of the Pd plating layer 223a. The adsorbed hydrogen increases internal stress of the Pd plating layer 223a, and thus, causing defects which can facilitate corrosion of the lead frame.

To solve these problems, the present invention provides formation of a metal diffusion layer 223 by heat-treating the Ni plating layer 222 and the Pd plating layer 223a. The metal diffusion layer 223 reduces the galvanic potential difference between the Ni plating layer 222 and the Pd plating layer 223a, and also discharges the hydrogen contained in the Pd plating layer 223a into the air.

By this diffusion process, some of the Ni or Ni alloy constituents of the Ni plating layer 222 diffuses into the Pd plating layer 223a by the heat treatment of the Ni plating layer 222 and the Pd plating layer 223a. At the same time, some of the Pd or Pd alloy constituents of the Pd plating layer 223a can diffuse into the Ni plating layer 222. As a result, a compound layer of the Pd plating layer 223a incorporating some of Ni or Ni alloy constituents therein, or a compound layer of the Ni plating layer 222 and the Pd plating layer 223a in which Ni and Pd (or their alloys) are combined together, is formed. The compound layer in which Ni and Pd constituents are combined, is the metal diffusion layer 223. (S30)

It is noted that lead frames formed by the conventional methods discussed above have a boundary line between the Ni plating layer 222 and the Pd plating layer 223a, on which there is a great galvanic potential difference. However, the diffusion layer 223 formed according to the present invention has a structure in which the Ni concentration gradually decreases from the boundary line of the Ni plating layer 222 and, on the other hand, the Pd concentration gradually increases from the boundary line of the Ni plating layer 222.

Figure 6:
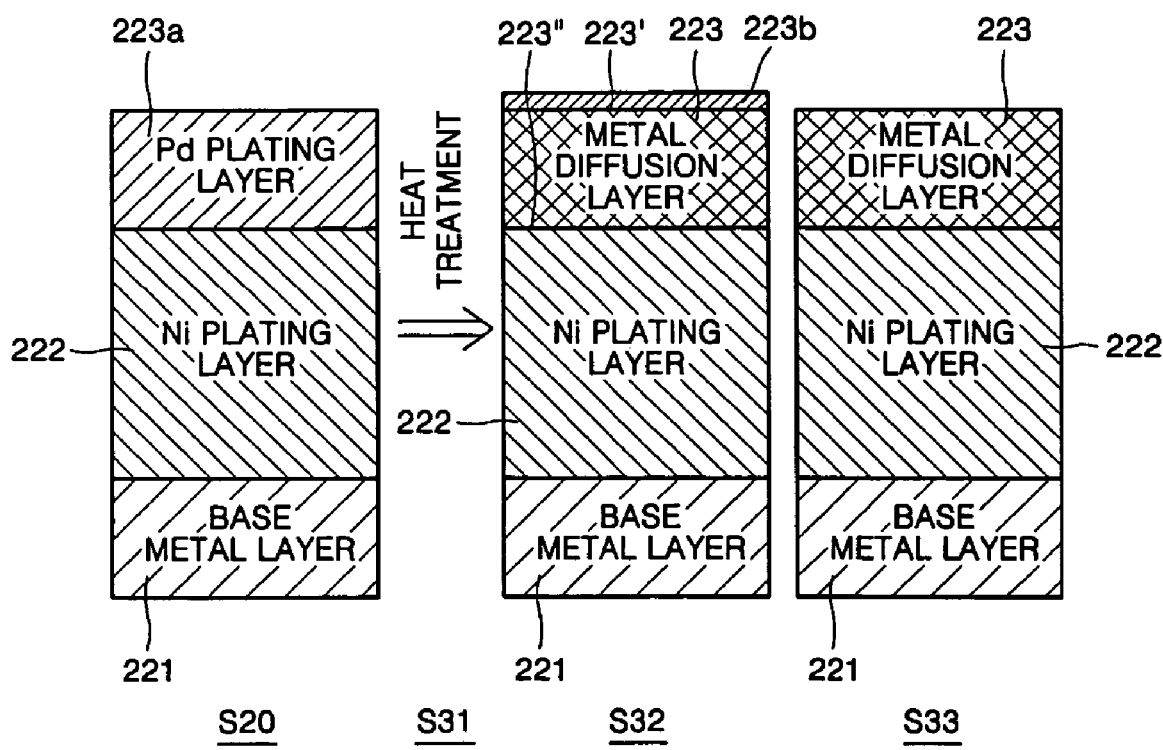
FIG. 6 is a schematic, cross-sectional view illustrating a process of formation of a diffusion layer according to one embodiment of the present invention.

More specifically, with reference to FIGS. 4 through 6, the diffusion layer 223 has a structure in which the Pd concentration gradually increases from the lower surface 223" (which contacts with the Ni plating layer 222) to an upper surface 223' by the heat treatment process (S31). Accordingly, corrosion due to the galvanic potential difference can be avoided since there is no significant galvanic potential difference between the Ni plating layer 222 and the Pd plating layer 223a (or the diffusion layer 223).

It is preferable that the Pd concentration at the upper surface 223' of the metal diffusion layer 223 is between about 5% and about 80%. It is noted that the soldering wettability of the metal diffusion layer 223 becomes inadequate if the Pd concentration is below 5%. Also, if the Pd concentration exceeds 80%, the gradient of the Pd concentration becomes too steep from the lower surface 223" that can cause a galvanic potential difference between the Ni plating layer 222 and the Pd plating layer 223a.

The heat treatment is especially effective when the base metal layer 221 is formed of "alloy 42" since a galvanic potential difference between Pd of the Pd plating layer 223a and Fe or Ni of the Ni plating layer 222 can be minimized.

Moreover, when heat-treating the Pd and Ni layers, the hydrogen introduced during deposition of the Pd plating layer 223a is activated by the high temperature, and diffuses to the upper surface of the diffusion layer 223 and then discharges into the air through the reaction amongst the hydrogen atoms. As the result, stresses due to the presence of hydrogen in the Pd plating layer 223a can be reduced, and corrosion can be limited and the density of the diffusion layer 223 is increased.

In addition, when heat-treating the Ni and Pd layers having a high hardness, the molecular structure of Ni and Pd becomes uniform due to an annealing effect, and internal stresses in the base metal layer 221 produced during the plating can be released. Accordingly, ductility of the Ni plating layer 222 and the diffusion layer 223 is increased, and the density of the plating layer structure can be increased by minimizing the number of pores through re-arranging a crystal structure.

Temperature of the heat-treating process (S31) is preferably greater than 150° C. since the metal diffusion layer 223 can not be formed into an optimum structure if the temperature is below 150° C. The temperature of heat-treating process is preferably below 900° C. This is because, if the temperature exceeds 900° C., an oxide layer can be formed and become thicker on the upper surface of the metal diffusion layer 223, and thus the soldering wettability becomes worse. It is difficult to remove the oxide layer.

The heat-treating time is preferably less than 20 minutes. If the heat-treating is performed more than 20 minutes, an oxide layer with a substantial thickness can be formed on an upper surface of the metal diffusion layer 223.

When using an oven for the heat-treating process, the heat-treating time is preferably more than 10 seconds. If the heat-treating is performed less than 10 seconds, a desirable metal diffusion layer 223 cannot be formed. If the heat-treating is performed by a laser, the metal diffusion layer 223 can be formed in a short time, possibly less than 10 seconds.

Therefore, the heat-treating time is preferably a time sufficient to form the diffusion layer 223.

These heat treatment conditions are primarily set in consideration for providing at least a minimum time for transferring an activation energy required for diffusion of the metal constituents and also for avoiding damage to the semiconductor package. However, the energy required for diffusion of the metal can be supplied by other methods not described herein.

As illustrated in FIG. 6, an oxide layer 223b can occasionally be formed on the metal diffusion layer 223 as a result of oxidation of the upper surface 223' of the metal diffusion layer 223 through the heat-treating process (S31). The oxide layer 223b blocks the releasing of the hydrogen adsorbed in the plating layer during depositing the Pd plating layer 223a and reduces density and adhesiveness of the protective plating layer.

Therefore, if there is an oxide layer 223b on the metal diffusion layer 223 after heat-treating process (S31, S32), it is preferable to perform a physical or chemical process (S33) for removing the oxide layer 223b. For example, the oxide layer 223b can be removed by a plasma processing using a gas mixture of argon and oxygen or by using a nickel active solvent of an organic acid group in which HCI is added.

After the heat-treating process, a protective plating layer 224 is disposed on the metal diffusion layer 223. The protective plating layer 224 is preferably formed of a noble metal having high oxidation resistance. Thus, oxidation of the surface of the metal diffusion layer 223 can be prevented by the protective plating layer of a noble metal on the metal diffusion layer 223.

The protective plating layer 224 is preferably formed of Au or an alloy of Au group. Here, the alloy of Au group denotes an alloy having similar properties to Au, such as an Ag alloy and an Au alloy which includes Au and a metal selected from the group consisting of Ag, Co, Ti, Pt, and Pd.

Advantages and further features of the method of producing a semiconductor package according to the present invention are disclosed by the following illustrative embodiments or experiments of the present invention, but the present invention is not limited thereto.

Experiments

A specimen used in the experiment is a pre-plated lead frame with 54TSOP2 alloy 42. The pre-plated frame was prepared as follows: i.e., Ni plating layer 222 with a thickness of 80μ" (micro inch) was formed on base metal layer 221 of alloy 42, Pd plating layer 223a with a thickness of 0.5-0.8μ" was formed on the Ni plating layer 222, the Ni plating layer 222 and the Pd plating layer 223a were then heat-treated, and protective plating layer 224 of Au and Ag with a thickness of 0.8-1.5μ" was formed on the heat-treated Pd plating layer 223a.

The heat treatment process was performed using a lead frame reel-to-reel heat treatment apparatus with the lead frames supplied at a speed of 9 m/min. The heat treatment temperature was 690° C. and nitrogen-hydrogen gases were supplied to the heat treatment apparatus to prevent rapid oxidation of the Ni plating layer 222 and the Pd plating layer 223a.

1. Analysis of Surface Compositions Right After the Heat Treatment

Figure 7:
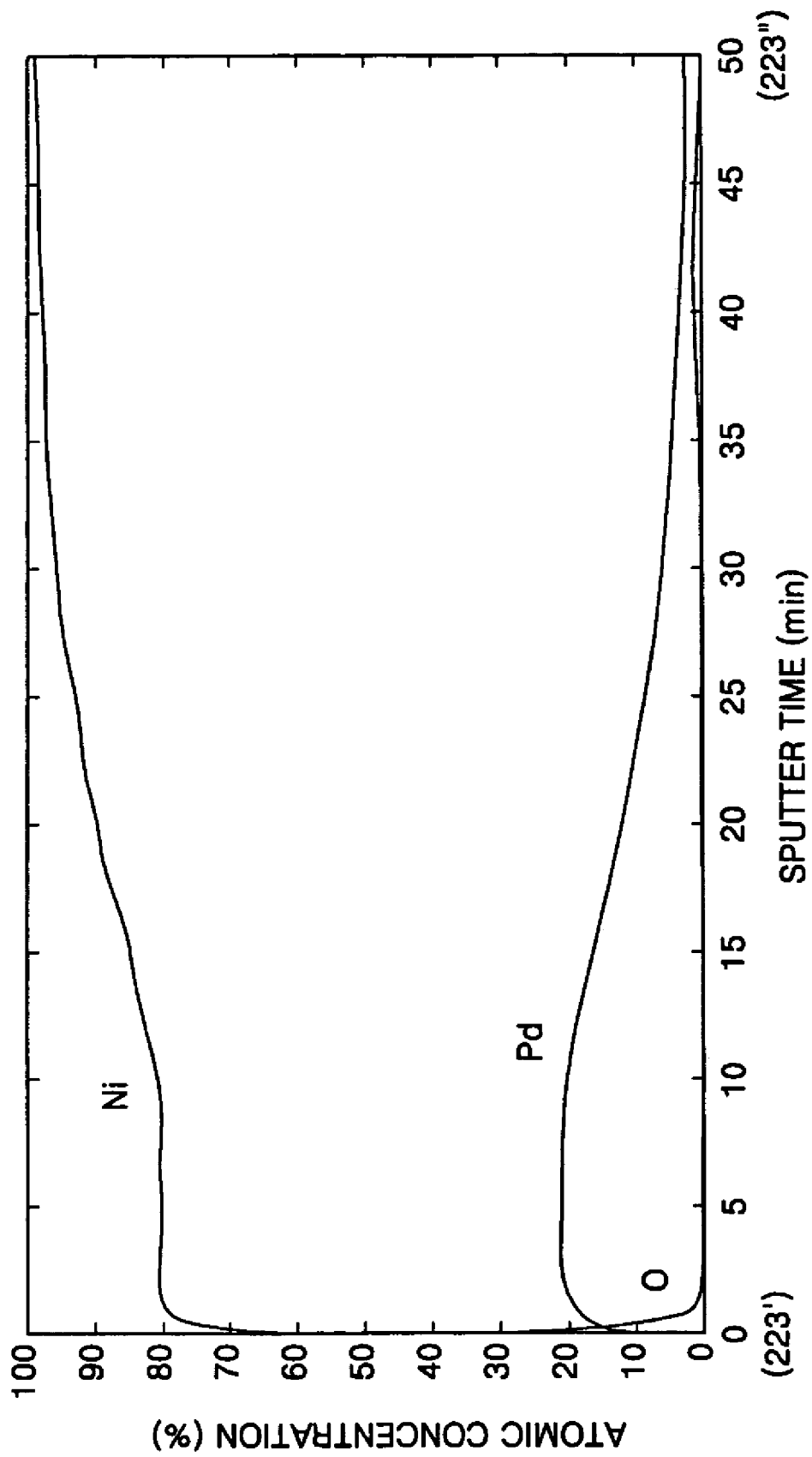
FIG. 7 is a graph showing a result of a surface component analysis performed using an auger electron spectroscopy (AES) after a heat treatment of a lead frame according to one embodiment of the present invention.

Surface compositions of the lead frame was analysed right after the heat treatment using an auger electron spectroscopy (AES). The lead frame for this analysis is prior to form the protective plating layer 224. FIG. 7 is a graph showing a result of a surface component analysis obtained using an auger electron spectroscopy (AES) soon after heat treatment of the lead frame manufactured according to an embodiment of the present invention.

As shown in FIG. 7, Pd concentration at an upper surface 223' of the metal diffusion layer 223 of the lead frame was 20% and the Pd concentration gradually decreased toward the inner side of the metal diffusion layer 223. That is, the metal diffusion layer 223 has a configuration of gradually increasing Pd concentration from the lower surface 223" to the upper surface 223' as the result of the heat treatment process (S31).

2. Salt Spray Test

A corrosion resistance evaluation was made by a salt spray test. The chamber was maintained at a temperature of 35° C. and a 5% sodium chloride solution was sprayed 40 g/m2 per 24 hr. At this time, the lead frame had the Ni plating layer 222, the metal diffusion layer 223, and the protective plating layer 224 on the base metal layer 221.

Figure 8A:
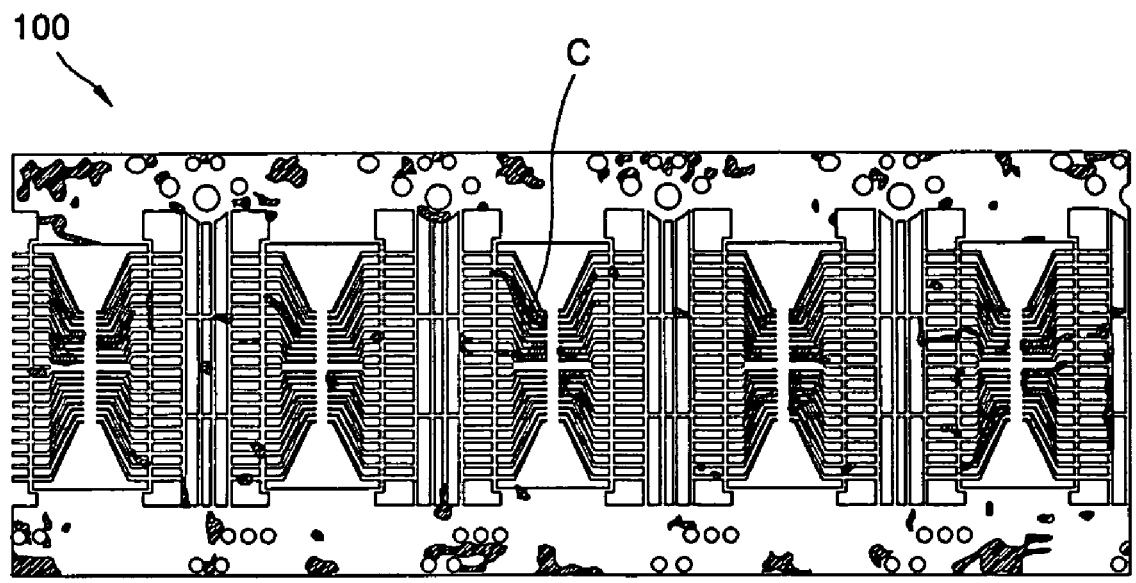
FIG. 8A is a photographic image showing a result of a salt spray test conducted with a conventional lead frame.

FIG. 8A is a photo image of a lead frame showing the result of the salt spray test using the lead frame which was not subjected to the heat treatment discussed above. Referring to FIG. 8A, a lot of corrosion spots C exist on the lead frame before the heat treatment.

Figure 8B:
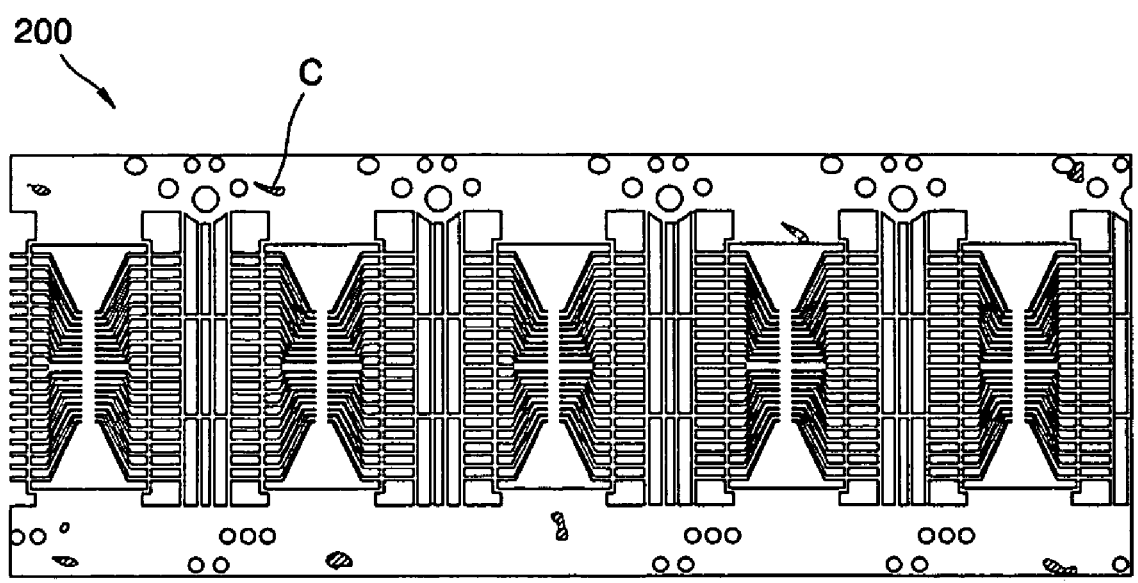
FIG. 8B is a photographic image showing a result of a salt spray test conducted with a lead frame produced according to one embodiment of the present invention.

FIG. 8B is a photo image of a lead frame showing the result of the salt spray test using the lead frame which was subjected to the heat treatment discussed above. Referring to FIG. 8B, almost no corrosion spot exist on the lead frame after the heat treatment.

It can be noticed from the result of the experiments above that, when the lead frame 200 having the Ni plating layer 222 and the Pd plating layer 223a is subject to the heat-treatment to form the metal diffusion layer 223 as described above (prior to the deposition of the protective plating layer 224), the Pd concentration of the metal diffusion layer 223 gradually increases from the lower surface 223" to the upper surface 223'. As a result, corrosion of the lead frame 200 can be avoided or at least substantially minimized.

Figure 9:
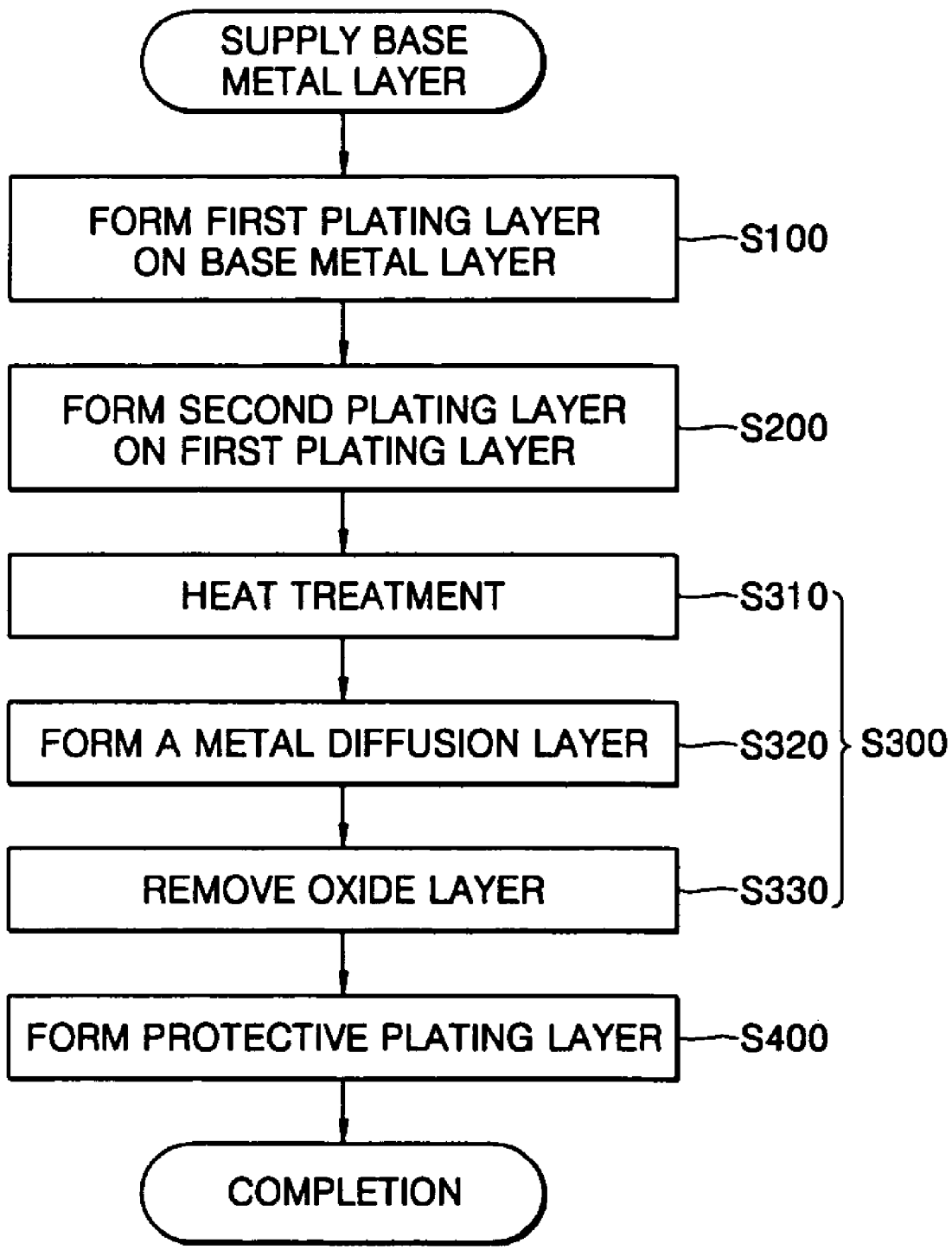
FIG. 9 is a flow chart illustrating a method of manufacturing a lead frame according to another embodiment of the present invention.

FIG. 9 is a flow chart of a method of producing a lead frame according to another embodiment of the present invention.

As depicted in FIG. 9, the method of producing the lead frame includes forming a first plating layer on a base metal layer (S100), heat-treating the first plating layer (S300) to form a diffusion layer, and forming a protective plating layer on the first plating layer (S400). The first plating layer is preferably composed of a Ni or Ni—Pd alloy.

The operation of heat-treating (S300) includes forming a metal diffusion layer through heat treatment of the first plating layer (S310) and removing an oxide layer formed on the metal diffusion layer (330). Here, detailed descriptions about the process of heat-treating (S300) and forming the protective plating (S400) are omitted since the process is identical to the method of producing a lead frame according to the first embodiment of the present invention described above.

It is preferable that the first plating layer includes a material having a superior wettability to Ni. More specifically, it is preferable that the first plating layer is formed of an alloy in which Ni and Pd are included since Pd has a superior wettability to NI. After forming the first plating layer, an operation of heat-treating is performed.

Alternately, it is more preferable that a second plating layer composed of Pd or a Pd alloy is formed on the first plating layer, when the first plating layer is a Ni alloy layer. A subsequent heat-treating process (S300) is performed after forming of the first and second plating layers.

Here, the heat-treating process (S300) includes forming of a metal diffusion layer in which some constituents of the Pd or Pd alloy in the second plating layer are diffused into the first plating layer and some constituents of the Ni or Ni alloy in the first plating layer are diffused into the second plating layer. The metal diffusion layer is preferably formed so as to gradually increase the concentration of Pd from the lower surface contacting the first plating layer to the upper surface.

Figure 10:
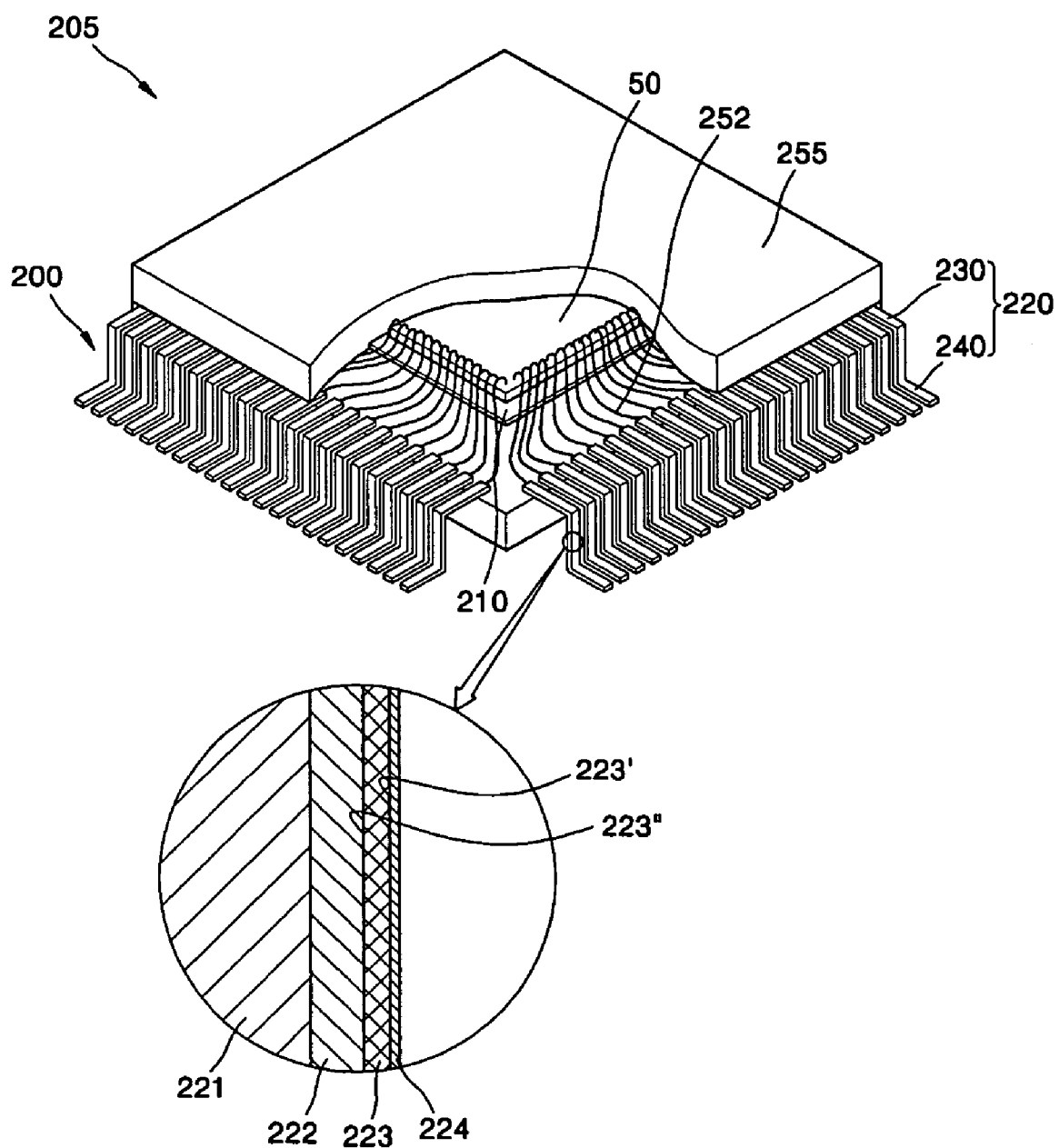
FIG. 10 is a perspective view illustrating a semiconductor package having a lead frame produced according to the principle of the present invention.

FIG. 10 is a perspective view illustrating a semiconductor package 205 having a lead frame 200 produced according to the principles of the present invention.

Referring to FIG. 10, the lead frame 200 comprises base metal layer 221, Ni plating layer 222, metal diffusion layer 223, and protective plating layer 224.

The base metal layer 221 forms a structural frame of the lead frame 200, and is formed of Ni and Fe, or Cu as its main component. According to one embodiment of the invention, the base metal layer 221 can preferably be formed of "alloy 42".

The Ni plating layer 222 is deposited or plated on the base metal layer 221. The Ni plating layer 222 is formed of Ni or a Ni alloy and prevents the alloy 42, Ni, or Cu of the base metal layer 221 from diffusing into the surface of the lead frame.

The metal diffusion layer 223 is formed on the Ni plating layer 222. The metal diffusion layer 223 includes Pd and Ni, and has a structural configuration that the Pd concentration gradually increases from the lower surface contacting the Ni plating layer 222 toward the upper surface of the Pd plating layer 223a.

Accordingly, the metal diffusion layer 223 according to the present invention has a structure such that the Ni concentration gradually decreases upwardly from the boundary of the Ni plating layer 222 and the Pd concentration gradually increases upwardly from the boundary of the Ni plating layer 222, unlike conventional lead frames in which a boundary is formed between the Ni plating layer and the Pd plating layer which has different galvanic potentials from each other. Therefore, corrosion due to the galvanic potential difference between the Ni plating layer 222 and the metal diffusion layer 223 can be limited.

As described above, the Pd concentration in the upper surface 223' of the metal diffusion layer 223 is preferably between 5% and 80%. If the Pd concentration is less than 5%, the metal diffusion layer 223 does not have a sufficient soldering wettability, and on the contrary, if the Pd concentration exceeds 80%, the gradient of Pd concentration from the lower surface of the metal diffusion layer 223 contacting the Ni plating layer 222 becomes too steep, therefore, there is a possibility of generating a galvanic potential difference between the Ni plating layer 222 and the metal diffusion layer 223.

The metal diffusion layer 223 is preferably formed by a heat treatment process according to the method as described above.

That is, as described above in connection with FIGS. 5A through 5D, a portion of Ni or a Ni alloy of the Ni plating layer 222 diffuses into the Pd plating layer 223a, and a portion of Pd or a Pd alloy of the Pd plating layer 223a diffuses into the Ni plating layer 222 by the heat treatment of the Ni plating layer 222 and the Pd plating layer 223a. As a result, the Pd plating layer 223a comprises Pd and Ni components therein, and the Pd concentration in the diffusion layer 223 gradually increases upwardly from lower the boundary of the Ni plating layer 222.

In addition, through the heat treatment, the hydrogen adsorbed during the deposition of the Pd plating layer 223a becomes activated by the high temperature of the heat treatment, and is discharged into the air by a reaction between the hydrogen atoms. Accordingly, stresses caused by hydrogen can be reduced and density of the metal diffusion layer 223 is increased, and thereby improving its corrosion resistant property.

Moreover, during the heat-treatment of the Ni and Pd layers having a great hardness, the molecular structure of the Ni and Pd layers becomes uniform by an annealing effect and internal stresses in the base metal layer 221 caused during the plating can be reduced. Accordingly, ductility of the Ni plating layer 222 and the metal diffusion layer 223 is increased, and the density of a plating layer structure can be increased by minimizing the number of pores through re-arranging the crystal structure.

The protective plating layer 224 is formed on the metal diffusion layer 223. The protective plating layer 224 protects the exposed surface of the metal diffusion layer 223 from oxidation. Preferably, the protective plating layer 224 is formed of Au or an alloy of Au group. Here, the alloy of Au group denotes an alloy having similar properties to Au, such as an Ag alloy and an Au alloy which includes Au and a metal selected from the group consisting of Ag, Co, Ti, Pt, and Pd.

A complete semiconductor package 205 can be produced by mounting a semiconductor chip 50 on a lead frame 200 having the above structure and electrically connecting the semiconductor chip to the circuit terminals of the device.

As shown in FIG. 10 with the illustrative semiconductor package 205 as an example, the semiconductor chip 50 is seated on a die pad 210, inner leads 230 and the semiconductor chip 50 are wire bonded by a wire 252, and outer leads 240 are electrically connected to an external circuit unit such as a printed circuit board. The semiconductor chip 50 and the inner leads 230 form a semiconductor package 205 after they are moulded using an epoxy resin compound 255. The particular semiconductor package 205 depicted in FIG. 10 is shown only as an example, and the semiconductor package according to the present invention is not limited thereto.

According to the present invention, a metal diffusion layer, with the Pd concentration therein gradually increasing upwardly from the lower surface, can be formed by a heat treatment prior to the formation of a protective plating layer thereon. This configuration reduces a galvanic potential difference between the plating layers, and thus, can effectively prevent corrosion of the exposed surface of the lead frame.

Moreover, the density of a molecular structure of the plating layers increases since hydrogen adsorbed during deposition of the Pd layer is discharged to the outside during the high-temperature heat-treating process of the invention, and corrosion of the lead frame can further be restricted.

While the present invention has been particularly shown and described with reference to exemplary and illustrative embodiments thereof, it will be understood by those of ordinary skill in the art that various changes in form and details may be made therein without departing from the spirit and scope of the present invention as defined by the following claims.

What is claimed is:

1. A method of providing a lead frame for a semiconductor device, comprising:
   providing a base layer formed of a metallic material;
   plating a Ni or Ni alloy layer on the base layer;
   plating a Pd or Pd alloy layer on the Ni or Ni alloy layer;

heat-treating the Ni or Ni alloy layer and the Pd or Pd alloy layer, and thereby providing a diffusion layer at least in the Pd or Pd alloy layer with metallic constituents of the diffusion layer thermally diffused; and forming a protective plating layer on the diffusion layer.

2. The method of claim 1, wherein the heat-treating is performed at a temperature greater than 150° C.

3. The method of claim 1, wherein the diffusion layer contains Pd and Ni thermally diffused between the Ni plating layer and the Pd plating layer so that a Pd concentration gradually increases from a lower surface of the diffusion layer to an upper surface of the diffusion layer.

4. The method of claim 3, wherein the Pd concentration at the upper surface of the diffusion layer is between about 5% and about 80%.

5. The method of claim 1, further comprising removing of an oxide layer formed on a surface of the diffusion layer after formation of the diffusion layer.

6. The method of claim 1, wherein the protective plating layer is formed of Au or an Au alloy.

7. The method of claim 6, wherein the Ni or Ni alloy layer is formed to a thickness of 20-80μ", the Pd or Pd alloy layer is formed to a thickness of 0.5-0.8μ", and the protective plating layer is formed of an Au alloy or Ag alloy to a thickness of 0.8-1.5μ".

8. The method of claim 1, wherein the base layer is formed of alloy 42.

9. A method of providing a lead frame for a semiconductor device, comprising:

forming a first plating layer composed of an Ni alloy on a base metal layer formed of a metal;

heat-treating the first plating layer, and thereby providing a diffusion layer in the first plating layer with metallic constituents of the layer thermally diffused therein; and forming a protective plating layer on the diffusion layer.

10. The method of claim 9, wherein the first plating layer is formed of a Ni—Pd alloy.

11. The method of claim 9 further comprising forming of a second plating layer composed of Pd or a Pd alloy on the first plating layer, and the heat-treating step is performed after forming the first and second plating layers.

12. The method of claim 11, wherein the diffusion layer contains Pd and Ni thermally diffused between the first plating layer and the second plating layer such that a concentration of Pd gradually increases from a lower surface of the diffusion layer to an upper surface of the diffusion layer.

13. The method of claim 12, wherein the concentration of Pd at the upper surface of the metal diffusion layer is between about 5% and about 80%.

14. The method of claim 9, wherein the heat-treating is performed at a temperature of greater than 150° C.

15. The method of claim 9, further comprising removing of an oxide layer formed on a surface of the diffusion layer after formation of the diffusion layer.

16. The method of claim 9, wherein the protective plating layer is formed of gold (Au) or an Au alloy.

17. The method of claim 9, wherein the base metal layer is formed of alloy 42.

* * * * *